(12) United States Patent  
Cha et al.

(10) Patent No.: US 9,385,266 B2  
(45) Date of Patent: Jul. 5, 2016

(54) METHOD OF MANUFACTURING A NANOSTRUCTURE LIGHT EMITTING DEVICE BY PLANARIZING A SURFACE OF THE DEVICE

(71) Applicant: SAMSUNG ELECTRONICS CO., LTD., Suwon-si, Gyeonggi-do (KR)

(72) Inventors: Nam Goo Cha, Ansan-si (KR); Dong Ho Kim, Guri-si (KR); Geon Wook Yoo, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/165,168

(22) Filed: Jan. 27, 2014

(65) Prior Publication Data

US 2014/0246647 A1    Sep. 4, 2014

(30) Foreign Application Priority Data

Jan. 29, 2013 (KR) .................. 10-2013-0010112

(51) Int. Cl.
*H01L 33/00* (2010.01)
*H01L 33/08* (2010.01)
*H01L 33/24* (2010.01)
(Continued)

(52) U.S. Cl.
CPC .......... *H01L 33/0075* (2013.01); *H01L 33/005* (2013.01); *H01L 33/0095* (2013.01); *H01L 33/06* (2013.01); *H01L 33/08* (2013.01); *H01L 33/24* (2013.01); *H01L 33/36* (2013.01);
(Continued)

(58) Field of Classification Search
None
See application file for complete search history.

(56) References Cited

U.S. PATENT DOCUMENTS 7,511,308 B2    3/2009 Kim et al.
7,906,787 B2    3/2011 Kang
(Continued)

FOREIGN PATENT DOCUMENTS

JP    2012-040878 A    3/2012
KR    10-0470904 B1    1/2004
(Continued)

OTHER PUBLICATIONS

International Search Report issued in International Application No. PCT/KR2014/000810 dated May 13, 2014.
(Continued)

*Primary Examiner* — Mohammad Islam
*Assistant Examiner* — Mikka Liu
(74) *Attorney, Agent, or Firm* — F. Chau & Associates, LLC

(57) ABSTRACT

A nanostructure semiconductor light emitting device includes a base layer, an insulating layer, and a plurality of light emitting nanostructures. The base layer includes a first conductivity type semiconductor. The insulating layer is disposed on the base layer and has a plurality of openings through which regions of the base layer are exposed. The light emitting nanostructures are respectively disposed on the exposed regions of the base layer and include a plurality of nanocores having a first conductivity type semiconductor and having side surfaces provided as the same crystal planes. The light emitting nanostructures include an active layer and a second conductivity type semiconductor layer sequentially disposed on surfaces of the nanocores. Upper surfaces of the nanocores are provided as portions of upper surfaces of the light emitting nanostructures, and the upper surfaces of the light emitting nanostructures are substantially planar with each other.

19 Claims, 12 Drawing Sheets

(51) Int. Cl.
*H01L 33/06* (2010.01)
*H01L 33/36* (2010.01)
*H01L 33/44* (2010.01)

(52) U.S. Cl.
CPC ......... *H01L33/44* (2013.01); *H01L 2933/0016* (2013.01); *H01L 2933/0025* (2013.01)

(56) References Cited

U.S. PATENT DOCUMENTS

| | | |
|---|---|---|
| 8,097,879 B2 | 1/2012 | Hu et al. |
| 8,212,266 B2 | 7/2012 | Lee et al. |
| 2007/0037365 A1* | 2/2007 | Ranganath ............. B82Y 10/00 438/478 |
| 2008/0246076 A1* | 10/2008 | Chen ................... H01L 21/0337 257/316 |
| 2010/0075114 A1 | 3/2010 | Kurihara et al. |
| 2012/0001153 A1 | 1/2012 | Hersee et al. |
| 2012/0061641 A1 | 3/2012 | Seong et al. |
| 2012/0129283 A1 | 5/2012 | Pan et al. |
| 2012/0129290 A1 | 5/2012 | Lin |
| 2012/0132888 A1 | 5/2012 | Kwak et al. |
| 2012/0235117 A1* | 9/2012 | Fukui et al. ..................... 257/13 |
| 2013/0099199 A1 | 4/2013 | Cha et al. |
| 2013/0112944 A1 | 5/2013 | Cha et al. |
| 2013/0153860 A1* | 6/2013 | Kim .................... H01L 51/0002 257/14 |
| 2014/0166974 A1* | 6/2014 | Yoo et al. ........................ 257/13 |
| 2014/0363912 A1* | 12/2014 | Ohlsson et al. ................. 438/35 |

FOREIGN PATENT DOCUMENTS

| | | |
|---|---|---|
| KR | 10-0661960 B1 | 12/2006 |
| KR | 2012-0028104 A | 3/2012 |
| KR | 10-2012-0058137 A | 6/2012 |
| KR | 10-2013-0025716 A | 3/2013 |
| KR | 10-2013-0040518 A | 4/2013 |
| KR | 10-1258583 B1 | 4/2013 |
| KR | 10-2013-0051240 A | 5/2013 |

OTHER PUBLICATIONS

Katsuhiro Tomioka, et al.; GaAs/AlGaAs Core Multishell Nanowire-Based Light-Emitting Diodes on Si; Nano Lett., 2010, 10 (5), pp. 1639-1644.

Shunfeng Li, et al. ; GaN based nanorods for solid state lighting ; Journal of Applied Physics 111, 071101 (2012).

* cited by examiner

METHOD OF MANUFACTURING A NANOSTRUCTURE LIGHT EMITTING DEVICE BY PLANARIZING A SURFACE OF THE DEVICE

CROSS-REFERENCE TO RELATED APPLICATION

This application claims benefit of priority from Korean Patent Application No. 10-2013-0010112, filed on Jan. 29, 2013, in the Korean Intellectual Property Office, the entire contents of which are hereby incorporated by reference.

TECHNICAL FIELD

The present inventive concept relates to a nanostructure semiconductor light emitting device and a method of manufacturing the same.

BACKGROUND

A semiconductor light emitting device such as a light emitting diode (LED), a device including materials emitting light, may convert energy generated through the recombination of electrons and electron holes in a junction semiconductor into light to be emitted therefrom. Light emitting diodes are widely used in lighting devices and display devices and as lighting sources, and the development thereof has therefore been accelerated.

Recently, a semiconductor light emitting device having a nanostructure in order to increase luminous efficiency through improved crystallinity and an increased light emitting area, and a manufacturing technique thereof have been suggested. A semiconductor light emitting device having a nanostructure may generate a relatively low amount of heat and may have an increased surface area due to the nanostructure, such that a light emitting area thereof may be increased to enhance luminous efficiency. In addition, an active layer may be obtained from a non-polar surface or a semi-polar surface to prevent luminous efficiency from being deteriorated due to polarization, thereby improving droop characteristics.

SUMMARY

An aspect of the present inventive concept provides a nanostructure semiconductor light emitting device having stable luminous efficiency by utilizing advantages provided by a nanostructure, and a method of manufacturing the same.

An aspect of the present inventive concept relates to a nanostructure semiconductor light emitting device including a base layer having a first conductivity type semiconductor, an insulating layer disposed on the base layer and having a plurality of openings through which regions of the base layer are exposed, and a plurality of light emitting nanostructures respectively disposed on the exposed regions of the base layer. The plurality of light emitting nanostructures include a plurality of nanocores that include a first conductivity type semiconductor and has side surfaces provided as the same crystal planes, and an active layer and a second conductivity type semiconductor layer sequentially disposed on surfaces of the nanocores. Upper surfaces of the nanocores are provided as portions of upper surfaces of the light emitting nanostructures, and the upper surfaces of the light emitting nanostructures are substantially planar with each other.

The active layer may be disposed only on the side surfaces of the nanocores.

The nanostructure semiconductor light emitting device may further include a passivation layer disposed to cover the upper surfaces of the light emitting nanostructures.

The side surfaces of the nanocores may be crystal planes perpendicular to an upper surface of the base layer.

The light emitting nanostructures and the base layer may include a nitride single crystal, and the side surfaces of the nanocores may be non-polar m-planes.

A first group of nanocores among the plurality of nanocores may have cross-sectional areas different from cross-sectional areas of a second group of nanocores among the plurality of nanocores.

A third group of nanocores among the plurality of nanocores may have an interval therebetween different from an interval between a fourth group of nanocores among the plurality of nanocores.

Another aspect of the present inventive concept encompasses a method of manufacturing a nanostructure semiconductor light emitting device. According to the method, a plurality of nanocores are grown on selective portions of a base layer including a first conductivity type semiconductor, using a first conductivity type semiconductor. each of the plurality of nanocores includes a main part that has a side surface having a first crystal plane in a growth direction and an upper part that has a surface having a second crystal plane different from the first crystal plane. A plurality of light emitting nanostructures is formed by sequentially growing an active layer and a second conductivity type semiconductor layer on surfaces of the respective nanocores. A contact electrode is formed on a surface of the second conductivity type semiconductor layer. A surface of the nanostructure semiconductor light emitting device in which the contact electrode is disposed, is planarized so as to remove a portion of the active layer disposed on the second crystal plane.

The growing of the plurality of nanocores may include providing the base layer formed of the first conductivity type semiconductor. A mask including an etch stop layer is formed on the base layer. A plurality of openings are formed through which regions of the base layer are exposed, in the mask. The plurality of nanocores are formed by growing the first conductivity type semiconductor on the exposed regions of the base layer so as to fill the plurality of openings with the first conductivity type semiconductor. The mask are partially removed by using the etch stop layer to expose the side surfaces of the plurality of nanocores.

The mask may include a first material layer disposed on the base layer and serving as the etch stop layer and a second material layer disposed on the first material layer and having an etching rate lower than an etching rate of the first material layer.

The mask may include first to third material layers sequentially disposed on the base layer, and the second material layer may be formed of a material different from materials of the first and third material layers and may serve as the etch stop layer.

The method may further include heat treating the plurality of nanocores after the partially removing of the mask and before the sequentially growing of the active layer and the second conductivity type semiconductor layer.

The heat treating of the plurality of nanocores may be performed at a temperature ranging from 800 to 1200° C.

The method may further include applying a planarizing process to upper surfaces of the plurality of nanocores to be planarized to have an identical level, after the forming of the plurality of nanocores.

At least a group of nanocores among the plurality of nanocores may have cross-sectional areas or an interval therebetween different from cross-sectional areas of or an interval between another group of nanocores among the plurality of nanocores.

Still another aspect of the present inventive concept relates to a method of manufacturing a nanostructure semiconductor light emitting device. According to the method, a plurality of nanocores are grown on selective portions of abase layer including a first conductivity type semiconductor, by using a first conductivity type semiconductor. Each of the plurality of nanocore includes a main part that has a side surface having a first crystal plane in a growth direction and an upper part that has a surface having a second crystal plane different from the first crystal plane. A plurality of light emitting nanostructures are formed by sequentially growing an active layer and a second conductivity type semiconductor layer on surfaces of the respective nanocores. A contact electrode is formed on a surface of the second conductivity type semiconductor layer. A first electrode is formed on an exposed region of the base. A second electrode is formed on a portion of the contact electrode.

The forming of the first electrode may include selectively etching the contact electrode and the plurality of light emitting nanostructures to expose the exposed region of the base layer.

A passivation layer may be formed on the light emitting nanostructure and the contact electrode may be formed above the passivation layer.

The passivation layer may be formed only on an upper surface of the light emitting nanostructure.

Before the forming of the first and second electrodes, an insulating layer may be formed on the contact electrode to expose the exposed region of the base layer and the portion of the contact electrode layer.

BRIEF DESCRIPTION OF THE DRAWINGS

The above and other aspects, features and other advantages of the present inventive concept will be more clearly understood from the following detailed description taken in conjunction with the accompanying drawings, in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
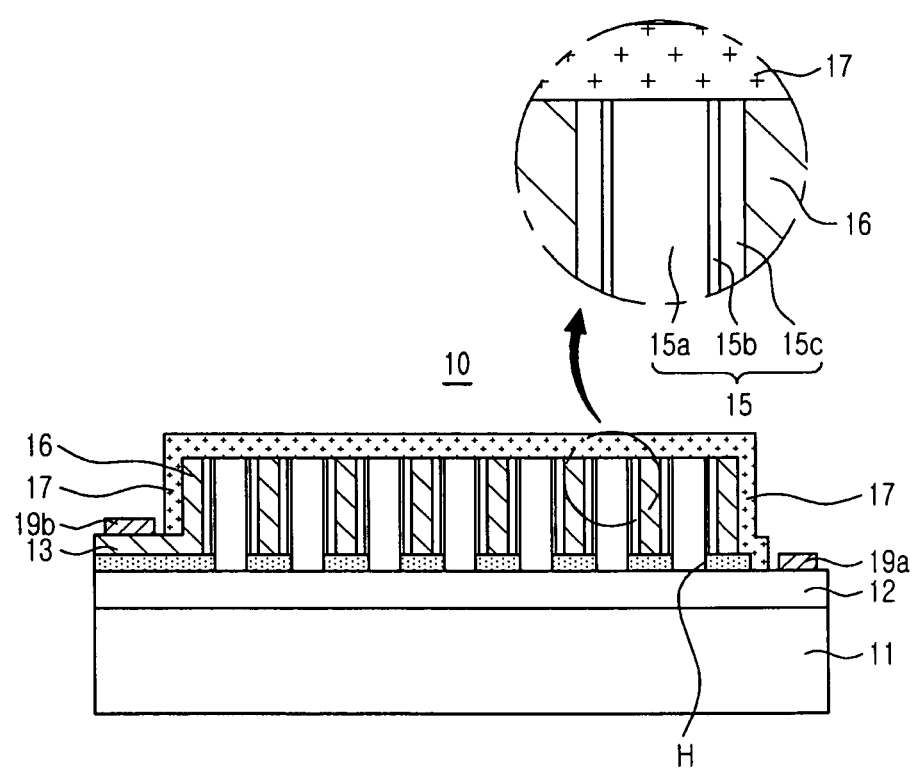
FIG. 1 is a side cross-sectional view of a nanostructure semiconductor light emitting device according to an embodiment of the present inventive concept.

Hereinafter, embodiments of the present inventive concept will be described in detail with reference to the accompanying drawings.

The present inventive concept may, however, be embodied in many different forms and should not be construed as being limited to the embodiments set forth herein. Rather, these embodiments of present inventive concept are provided so that this disclosure will be thorough and complete, and will fully convey the scope of the present inventive concept to those skilled in the art.

In the drawings, the shapes and dimensions of elements may be exaggerated for clarity, and the same reference numerals will be used throughout to designate the same or like elements.

FIG. 1 is a side cross-sectional view of a nanostructure semiconductor light emitting device according to an embodiment of the present inventive concept.

As illustrated in FIG. 1, a nanostructure semiconductor light emitting device 10 according to an embodiment of the present inventive concept may include a base layer 12 formed of a first conductivity type semiconductor material and a plurality of light emitting nanostructures 15 formed on the base layer 12.

The base layer 12 may be formed on a substrate 11 and provide a growth surface for the light emitting nanostructures 15, as well as electrically connecting each of light emitting nanostructures 15.

The substrate 11 may be an insulating substrate, a conductive substrate or a semiconductor substrate. For example, the substrate 11 may be formed of sapphire, SiC, Si, $MgAl_2O_4$, MgO, $LiAlO_2$, $LiGaO_2$, or GaN. The base layer 12 may be a nitride semiconductor satisfying $Al_xIn_yGa_{1-x-y}N$ ($0\leq x\leq 1$, $0\leq y\leq 1$, $0\leq x+y\leq 1$) and may be doped with n-type impurities such as silicon (Si) so as to have a specific conductivity type.

An insulating layer 13 having openings H may be formed on the base layer 12, and the openings H may be provided for growth of the light emitting nanostructures 15. The base layer 12 may be exposed through the openings H and cores 15a (also referenced as nanocores 15a throughout the disclosure) may be formed on exposed regions of the base layer 12. The insulating layer 13 may be used as a mask for growth of the nanocores 15a. The insulating layer 13 may be formed of an insulating material that may be used in a semiconductor process, such as SiO2 or SiNx.

The light emitting nanostructures 15 may include the nanocores 15a formed of a first conductivity type semiconductor and an active layer 15b and a second conductivity type semiconductor layer 15c sequentially formed on surfaces of the nanocores 15a.

The active layer 15b may have a multi-quantum well (MQW) structure in which quantum well and quantum barrier layers are alternately stacked. For example, when the active layer 15b may be formed of a nitride semiconductor, a GaN/InGaN structure may be used, but a single quantum well (SQW) structure may also be used. The second conductivity type semiconductor layer 15c may be a crystal satisfying p-type $Al_xIn_yGa_{1-x-y}N$. The second conductivity type semiconductor layer 15c may include an electron blocking layer (not separately shown) in a portion thereof adjacent to the active layer 15b. The electron blocking layer (not separately shown) may have a multilayer structure in which a plurality of layers having different compositions of n-type $Al_xIn_yGa_{1-x-y}N$ are stacked, or may include at least one layer composed of $Al_yGa_{(1-y)}N$. The electron blocking layer (not separately shown) may have a greater band gap than a band gap of the active layer 15b to prevent electrons from flowing to the second conductivity type (e.g., p-type) semiconductor layer 15c.

As illustrated in FIG. 1, upper surfaces of the nanocores 15a may be provided as portions of upper surfaces of the light emitting nanostructures 15, and the upper surfaces of the light emitting nanostructures 15 may have substantially planar surfaces.

In the light emitting nanostructures 15, the active layer 15b may be present only on side surfaces of the nanocore 15a and may not be present on the upper surface of the nanocore 15a. Since the nanocore 15a may be formed of a first conductivity type semiconductor as described above and the side surfaces thereof may be the same crystal planes, the active layer 15b may be formed on the same crystal planes. Thus, a defect, in which luminescence properties of the active layer 15b are changed depending on a crystal plane, may be solved. This will be described in detail with reference to FIGS. 2A and 2B.

Figure 2A:
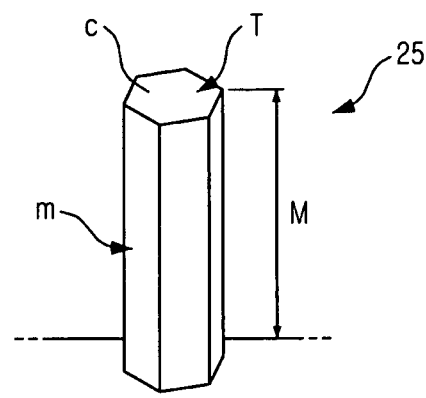
FIGS. 2A and 2B are views respectively illustrating examples of a nanocore employed in an embodiment of the present inventive concept.

As illustrated in FIG. 2A, the nanocore 15a' may include a main part M providing side surfaces having first crystal planes (for example, m-planes) in a growth direction and an upper part T providing a surface having a second crystal plane (for example, a c-plane) different from the first crystal planes.

When the base layer 12 is a nitride single crystal including an upper surface having a c-plane, the side surfaces of the main part M may be crystal planes perpendicular to the growth surface of the base layer 12, that is, non-polar surfaces (m-planes) and the upper surface of the upper part T may have a c-plane perpendicular to the m-planes. In this manner, the surfaces of the nanocore 15a may be configured of a plurality of different crystal planes. Thus, even when the active layer 15b is grown on the surfaces of the nanocore 15a through the same process, a composition of the active layer 15b (in particular, the content of indium) may be different due to differences in characteristics of the respective crystal planes and consequently, a wavelength of light generated in the active layer grown on the upper surface (c-plane) of the nanocore 15a' may be different from a wavelength of light generated in the active layer grown on the side surfaces (m-planes) of the nanocore 15a'. The difference in wavelengths of light may be problematic and considered as a defect in terms of implementing uniform light having a desired wavelength.

The nanocore may have various crystal structures in view of the entirety thereof or in a portion thereof, such as a hexagonal pyramid structure as needed. The above described defect may be generated in another structural nanocore having a plurality of different crystal planes.

Figure 2B:
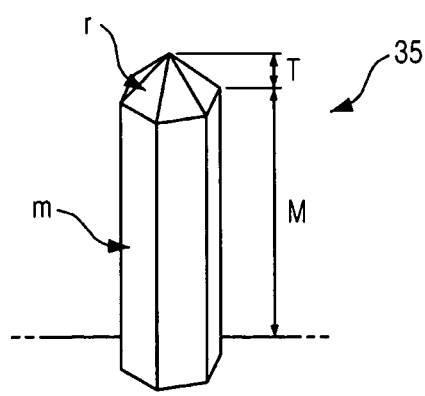

For example, the above described defect may be generated in a nanocore structure 15a" illustrated in FIG. 2B in a similar manner. The nanocore 15" may include the main part M having side surfaces provided as non-polar surfaces in a growth direction and the upper part T having an upper surface provided as a semi-polar surface (a r-plane) and in this case, the upper part T of the nanocore 35 may have a hexagonal pyramid structure, unlike the case of the nanocore 15a' illustrated in FIG. 2A. Even in this case, since the nanocore may have a plurality of different crystal planes, the composition of the active layer may be different depending on the crystal planes and consequently, a wavelength of light generated in the active layer formed on the upper part T of the nanocore 15a" may be different from a wavelength of light generated in the active layer formed on the side surfaces of the nanocore 15a'''.

In this manner, as illustrated in FIG. 1, since the side surfaces of the nanocore 15a may provide the same crystal planes and the active layer 15b may be formed only on the side surfaces of the nanocore 15a, the occurrence of a difference in luminescence properties due to a difference in crystal planes may be prevented.

Referring to FIG. 1, the nanostructure semiconductor light emitting device 10 according to an embodiment of the present inventive concept may include a contact electrode 16 formed in spaces between light emitting structures. As illustrated in FIG. 1, the contact electrode 16 may have an upper surface substantially coplanar with the upper surfaces of the light emitting structures 15.

A passivation layer 17 may be formed on the upper surfaces of the light emitting nanostructures 15. The passivation layer 17 may prevent the exposure and an undesired electrical connection of the active layer 15b.

A portion of the base layer 12 formed of a first conductivity type semiconductor may be exposed and a first electrode 19a may be formed on the exposed portion of the base layer 12. The contact electrode 16 formed between the light emitting nanostructures may be extended to a certain position above the base layer 12 and a second electrode 19b may be formed on the extension portion of the contact electrode 16.

In this manner, in the nanostructure semiconductor light emitting device of FIG. 1, the side surfaces of the nanocore 15a may have the same crystal planes and the active layer 15b may be provided only on the side surfaces of the nanocore 15a, whereby the active layer 15b may be formed only on the same crystal planes. Such structure may be obtained by providing the upper surface of the nanocore 15a as a portion of the upper surface of the light emitting nanostructure 15 and allowing the upper surface of the light emitting nanostructure 15 to have a substantially planar surface.

In this manner, a method of removing the active layer formed on the same crystal planes of the nanocore in a limited manner may be implemented using a planarizing process. FIGS. 3A through 3D are cross-sectional views illustrating respective main processes of a method of manufacturing a nanostructure semiconductor light emitting device according to an embodiment of the present inventive concept.

Figure 3A:
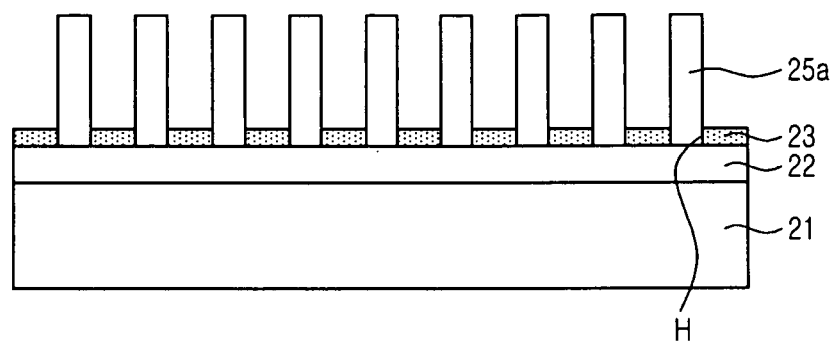
FIGS. 3A through 3D are cross-sectional views illustrating respective main processes of a method of manufacturing a nanostructure semiconductor light emitting device according to an embodiment of the present inventive concept.

As illustrated in FIG. 3A, an insulating layer 23 may be formed as a mask on a base layer 22 formed of a first conductivity type semiconductor and a plurality of nanocores 25a may be formed on exposed regions of the base layer 22.

The base layer 22 may be formed on a substrate 21 and provide a crystal growth surface for growing light emitting nanostructures thereon, as well as electrically connecting each of the light emitting nanostructures. Thus, the base layer 22 may be formed as a semiconductor single crystal having electrical conductivity. When the base layer 22 is directly grown, the substrate 21 may be a crystal growth substrate.

The base layer 22 may be a nitride semiconductor satisfying $Al_xIn_yGa_{1-x-y}N$ ($0 \le x \le 1$, $0 \le y \le 1$, $0 \le x+y \le 1$) and may be doped with n-type impurities such as silicon (Si). In this case, the substrate 21 may be formed of sapphire, SiC, Si, $MgAl_2O_4$, MgO, $LiAlO_2$, $LiGaO_2$, or GaN.

Referring to FIG. 3A, the insulating layer 23 may have a plurality of openings H through which regions of the base layer 22 may be exposed. The insulating layer 23 may expose the regions of the base layer 22 by forming the plurality of openings H after depositing an insulating material on the base layer 22. The insulating layer 23 may be formed of an insulating material such as SiO$_2$ or SiN. The openings H may have a width designed in consideration of a desired width of the light emitting nanostructures. For example, the openings H may be formed to have a width of 500 nm or less. Further, the openings H may be formed to have a width of 200 nm. Cross-sectional shapes and arrangements of the openings H may be variously formed and for example, the openings H may have various cross-sectional shapes, such as a polygonal shape, a quadrangular shape, an elliptical shape, a circular shape or the like.

The nanocores 25a may be obtained by selectively growing a first conductivity type semiconductor using the insulating layer 23 as a mask. The first conductivity type semiconductor of the nanocores 25a may be an n-type nitride semiconductor and for example, may be a crystal satisfying an n-type $Al_xIn_yGa_{1-x-y}N$ ($0 \leq x \leq 1$, $0 \leq y \leq 1$, $0 \leq x+y \leq 1$). The first conductivity type semiconductor configuring the nanocores 25a may be identical to the first conductivity type semiconductor of the base layer 22. For example, the base layer 22 and the nanocores 25a may be formed of an n-type GaN.

A nitride single crystal configuring the nanocores 25a may be formed using a metal organic chemical vapor deposition (MOCVD) or a molecular beam epitaxy (MBE). The crystal may be grown only on the regions of the base layer 12 exposed through the openings, rather than being formed on the insulating layer 23, whereby desired nanocores 25a may be provided. An embodiment of the present inventive concept exemplifies the nanocore having a rod shape, but is not limited thereto. For example, the nanocore may have a polypyramidal shape such as a hexagonal pyramid shape. The shape of the nanocore may be realized by adjusting growth conditions such as a growth temperature, a growth pressure, and a flow amount of source gas.

Figure 3B:
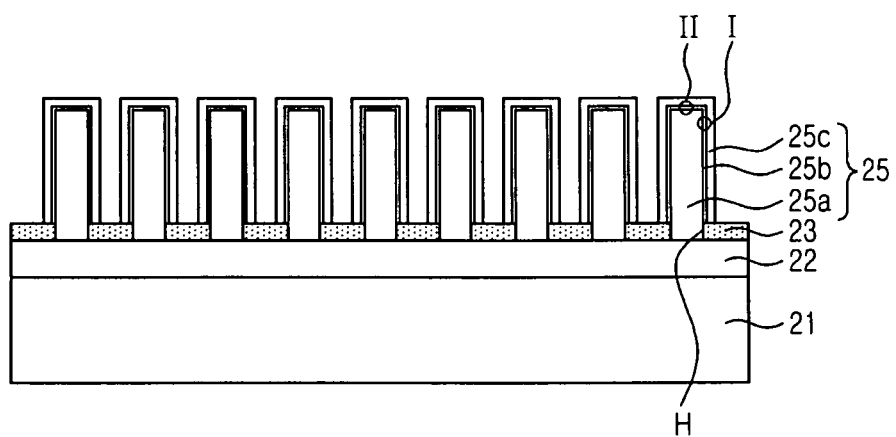

Next, as illustrated in FIG. 3B, an active layer 25b and a second conductivity type semiconductor layer 25c may be sequentially grown on surfaces of the plurality of nanocores 25a.

Through the process as described above, light emitting nanostructures 25 may have a core-shell structure in which the first conductivity type semiconductor is provided as the nanocores 25a, and the active layer 25b and the second conductivity type semiconductor layer 25c surrounding the respective nanocores 25a are provided as shell layers.

The active layer 25b may have a multiple quantum well (MQW) structure in which quantum well layers and quantum barrier layers are alternately stacked, for example, may have an GaN/InGaN structure in the case of a nitride semiconductor. Here, the active layer 25b may also have a single quantum well (SQW) structure.

The second conductivity type semiconductor layer 25c may be a crystal satisfying p-type $Al_xIn_yGa_{1-x-y}N$. The second conductivity type semiconductor layer 25c may include an electron blocking layer (not separately shown) in a portion thereof adjacent to the active layer 25b. The electron blocking layer (not separately shown) may have a multilayer structure in which a plurality of layers having different compositions of n-type $Al_xIn_yGa_{1-x-y}N$ are stacked or may have at least one layer configured of $Al_yGa_{(1-y)}N$. The electron blocking layer (not separately shown) may have a greater band gap than a band gap of the active layer 25b to thus prevent electrons from flowing to the second conductivity type (e.g., p-type) semiconductor layer 25c.

As illustrated in FIG. 3B, each of the plurality of nanocores 25a may include a main part providing side surfaces having first crystal planes in a growth direction and an upper part providing an upper surface having a second crystal plane different from the first crystal planes.

When the base layer 22 is a nitride single crystal including an upper surface having a c-plane, the side surfaces of the main part of the nanocores 25a may be crystal planes perpendicular to the growth surface of the base layer 22, that is, non-polar m-planes, and the upper surface of the upper part may have a c-plane perpendicular to the m-planes. In this manner, the surfaces of the nanocore 15a may be configured of a plurality of different crystal planes.

Thus, as described above, even when the active layer 25b is grown on the surfaces of the nanocore 25a through the same process, a composition of the active layer 25b (in particular, the content of indium) may be different due to differences in characteristics of the respective crystal planes.

Specifically, although the active layer 25b is grown through the same process, a portion II of the active layer 25b grown on the upper surface (c-plane) of the nanocore 25a may have the content of indium lower than a content of indium of a portion of the active layer 25b grown on the side surfaces (m-planes) of the nanocore 25a. As a result, the portion II of the active layer 25b grown on the upper surface (c-plane) of the nanocore 25a may emit light having a wavelength outside of an intended wavelength range. Thus, in an embodiment of the present inventive concept, a process of removing a portion of the active layer formed on a crystal plane of the nanocore, from which light having a wavelength outside of desired wavelength range may be emitted, may be additionally undertaken.

The processes as described above may be illustrated in FIGS. 3C and 3D.

Figure 3C:
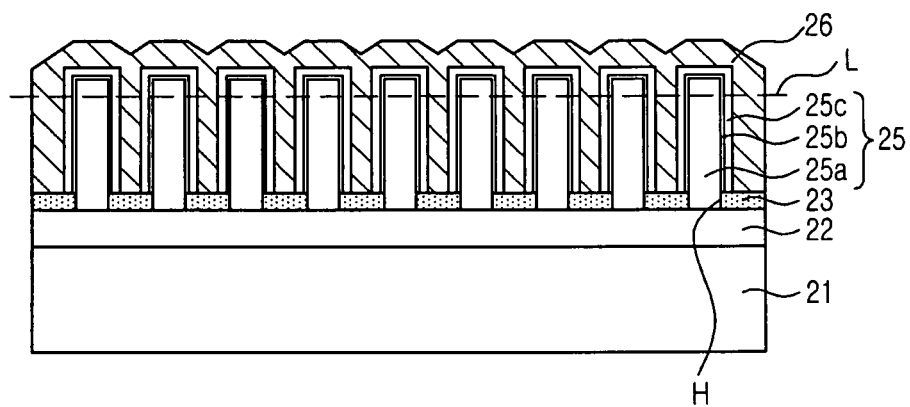

First, a contact electrode 26 may be formed on the light emitting nanostructures 25. In this case, as illustrated in FIG. 3C, the contact electrode 26 may be formed to fill spaces between the light emitting nanostructures 25. In this manner, the filled contact electrode 25 may serve to structurally support the light emitting nanostructures 25 in a subsequent planarizing process.

The contact electrode layer 26 may be obtained by forming a seed layer on the surfaces of the light emitting nanostructures 25 and then performing electroplating thereon. This seed layer may be formed of a material suitable for ohmic contact with the second conductivity semiconductor layer. As a material for the ohmic contact, GaN, InGaN, ZnO, or a graphene layer may be used. The contact electrode layer 26 may include a material such as Ag, Ni, Al, Rh, Pd, Ir, Ru, Mg, Zn, Pt, Au, or the like and may have a structure of two or more layers, for example, a layer structure of Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. For example, after sputtering an Ag/Ni/Cr layer as a seed layer, the contact electrode layer 26 may be formed by electroplating Cu/Ni.

The contact electrode layer 26 used in an embodiment of the present inventive concept may be formed using a reflective metal layer, and it can be understood that light is extracted to the substrate, but the embodiment of the present inventive concept is not limited thereto. The contact electrode layer 26 may be formed by employing a transparent electrode material such as indium tin oxide (ITO) such that light may be extracted from the light emitting nanostructure 25.

An embodiment of the present inventive concept illustrates that an electrode material is used as a support for the light emitting nanostructures 25; however, a method of providing a thin contact electrode layer along the surfaces of the light emitting nanostructures and providing a filling material may be implemented. In this case, an insulating filling material may be used as a support for the light emitting nanostructures in a subsequent planarizing process.

Then, a process of performing planarizing to a level L (see FIG. 3C) so as to remove a portion of the active layer formed on the upper surface of the nanocore 25a may be performed. As a result, the portion of the active layer 25b formed on the upper surface of the nanocore 25a may be removed, and the remaining portions of the active layer 25b may be formed only on the side surfaces of nanocore 25a. The side surfaces of the nanocore 25a may be the same crystal planes, such that the remaining portions of the active layer 25b may accurately exhibit desired wavelength characteristics.

In the nanocore 25a, since the side surfaces thereof may generally have a larger area than an area of the upper surfaces thereof, effects due to a reduction in a light emitting area may not be significant. In particular, in the case of the nanocore 25a having a high aspect ratio, improvements in luminescence properties, rather than the effects due to a reduction in a light emitting area, may be significant.

Figure 3D:
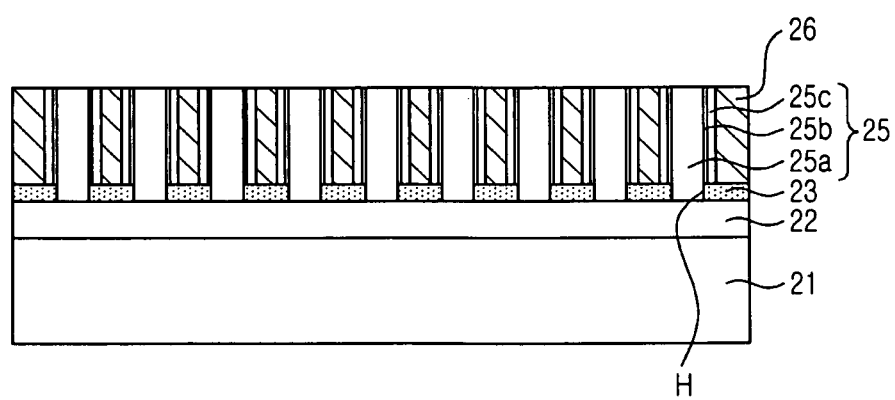

In the nanostructure semiconductor light emitting device of FIG. 3D, an electrode may be formed in various structures. FIGS. 4A through 4D are cross-sectional views illustrating respective main processes of an example of an electrode formation process.

Figure 4A:
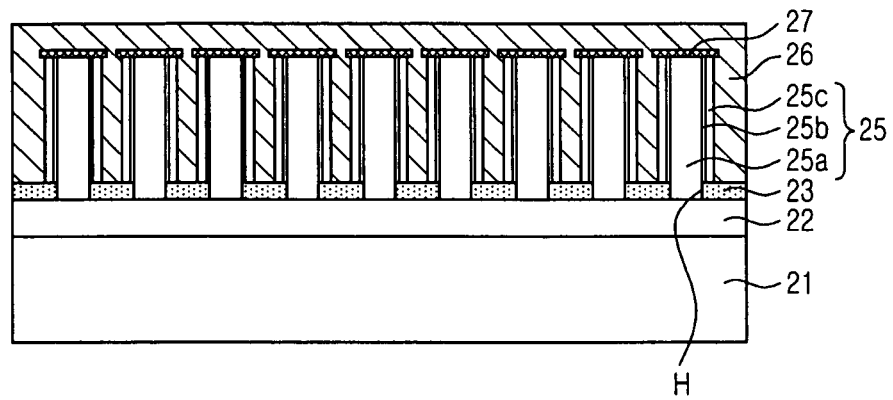
FIGS. 4A through 4D are cross-sectional views illustrating respective main processes of an electrode formation process for a resultant product resulting from FIG. 3D.

As illustrated in FIG. 4A, a passivation layer 27 may be formed on the light emitting nanostructure 25 and further, an upper electrode layer 26' may be formed above the passivation layer 27 so as to be connected to the contact electrode 26.

The passivation layer 27 employed in an embodiment of the present inventive concept may be formed only on the upper surface of the light emitting nanostructure 25, unlike the passivation layer 17 of the nanostructure semiconductor light emitting device 10 of FIG. 1. The upper electrode layer 26' may be formed above the passivation layer 27 so as to be connected to the contact electrode 26. The upper electrode layer 26' may be formed of an electrode material the same as an electrode material of a portion of the contact electrode 26.

Figure 4B:
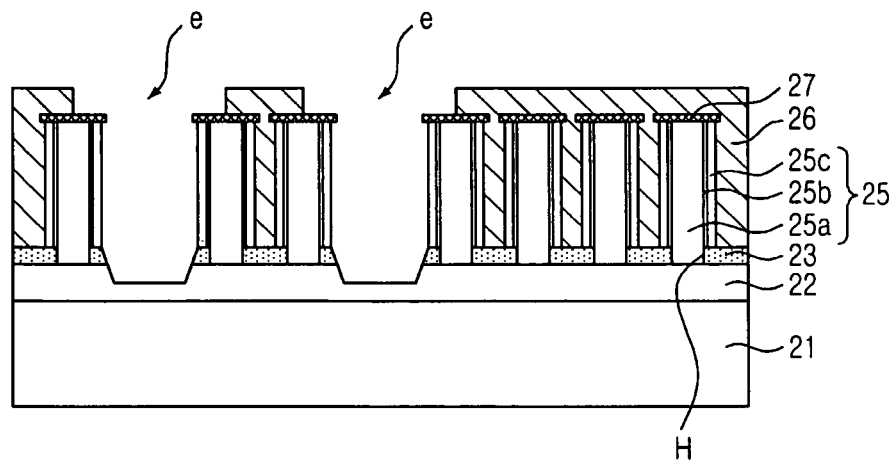

Next, as illustrated in FIG. 4B, the nanostructure 25 and electrode materials 26 and 26' positioned in regions, in which electrodes will be formed, may be selectively removed to expose portions e of the base layer 22.

Figure 4C:
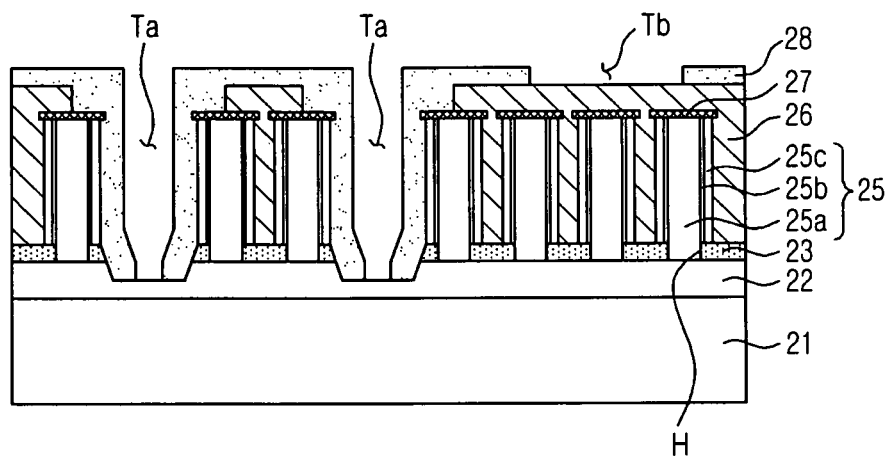

Next, as shown in FIG. 4C, an insulating layer 28 may be formed such that contact regions Ta and Tb of electrodes are exposed. The contact region Ta for a first electrode may be provided as an exposed region of the base layer 12, and the contact region Tb for a second electrode may be provided as a partial region of the upper electrode layer 26'. When the contact electrode 26 is exposed through the contact region Tb for the second electrode and the passivation layer 27 is formed of a material that may not be damaged in a selective etching process of the insulating layer 28, the process of forming the upper electrode layer 26' may be omitted.

Figure 4D:
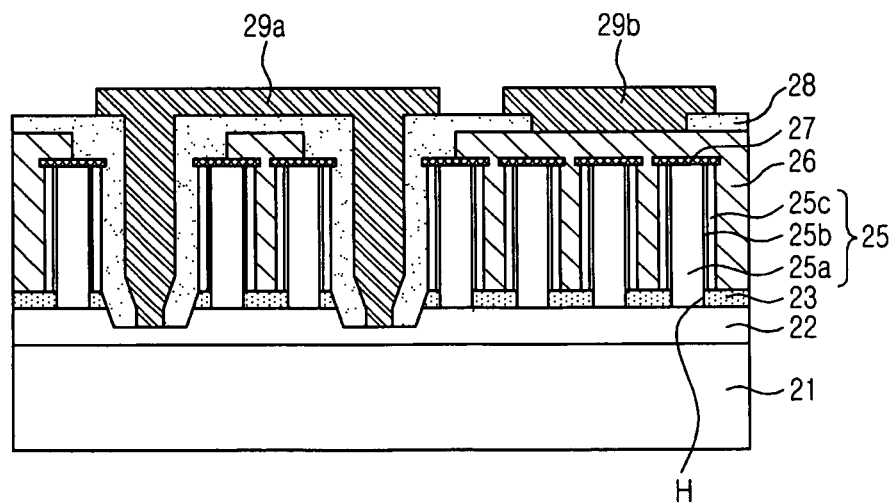

Thereafter, as shown in FIG. 4D, first and second electrodes 29a and 29b may be formed to be connected to the contact regions Ta and Tb, respectively. The first and second electrodes 29a and 29b may be formed of an identical electrode material. For example, a material for the first and second electrodes 29a and 29b may be Au, Ag, Al, Ti, W, Cu, Sn, Ni, Pt, Cr, NiSn, TiW, AuSn, or eutectic metals thereof.

The manufacturing method according to an embodiment of the present inventive concept may be variously modified. For example, a process of filling the nanocore using a mask as a mold structure to grow the nanocore may be advantageously used. FIGS. 5A through 5H are cross-sectional views illustrating respective main processes of a method of manufacturing a nanostructure semiconductor light emitting device according to another embodiment of the present inventive concept.

Figure 5A:
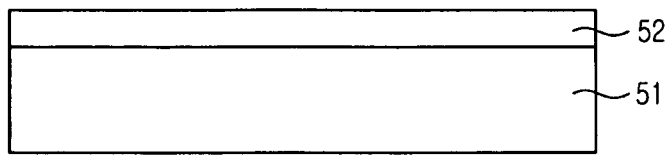
FIGS. 5A through 5H are cross-sectional views illustrating respective main processes of a method of manufacturing a nanostructure semiconductor light emitting device according to another embodiment of the present inventive concept.

As illustrated in FIG. 5A, a base layer 52 may be provided by growing a first conductivity type semiconductor on a substrate 51.

The base layer 52 may provide a crystal growth surface for growing light emitting nanostructures thereon and electrically connect each of the light emitting nanostructures. Therefore, the base layer 52 may be formed of a semiconductor single crystal having electrical conductivity. When the base layer 52 is directly grown, the substrate 51 may be a crystal growth substrate.

The base layer 52 may be a nitride semiconductor satisfying $Al_xIn_yGa_{1-x-y}N$ ($0 \leq x \leq 1$, $0 \leq y \leq 1$, $0 \leq x+y \leq 1$) and may be doped with n-type impurities such as silicon (Si). In this case, the substrate 51 may be formed of sapphire, SiC, Si, $MgAl_2O_4$, MgO, $LiAlO_2$, $LiGaO_2$, or GaN.

When the substrate is formed of silicon, the substrate may be warped or broken due to a difference in coefficients of thermal expansion between Gan and silicon, or the occurrence of defects may be possibly increased due to a difference in lattice constant. Therefore, in this case, since defects need to be suppressed while providing stress control to suppress warping, a buffer layer having a composite structure may be used. For example, on the substrate 51, a crystal not including Ga, such as AlN or SiC, may be used in order to prevent a reaction between Si and Ga. When a plurality of AlN layers are used, an AlGaN intermediate layer may be inserted therebetween to control stress in the center of GaN.

The substrate 51 may be entirely or partially removed or patterned during a chip manufacturing process to enhance light emission or electrical characteristics of an LED chip, before or after growing an LED structure.

For example, in the case of a sapphire substrate, a laser may be irradiated onto an interface between the substrate 51 and the base layer 52 through the substrate 51 to separate the substrate from the base layer. A silicon or silicon carbide substrate may be removed through a planarizing method, an etching method, or the like.

When the substrate 51 is removed, a separate support substrate (not separately shown) may be used. In the support substrate, a reflective metal may be attached thereto or a reflective structure may be inserted between junction layers in order to improve light extraction efficiency of an LED chip.

When the substrate is patterned, unevenness or roughness or an inclined surface may be formed on main surfaces or both side surfaces of the substrate before or after the growth of a single crystal to improve light extraction efficiency and crystalline properties. The size of a pattern may be selected from a range of 5 nm to 500 μm, and any pattern structure may be used as long as the pattern structure may increase light extraction efficiency using a regular or irregular pattern. The pattern may be variously formed, for example, may have a pillar shape, a peak-and-valley shape, a semispherical shape, or the like.

Figure 5B:
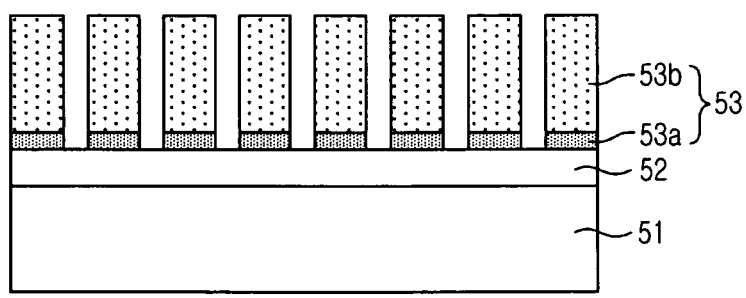

Next, as shown in FIG. 5B, a mask 53 having a plurality of openings H and an etch stop layer interposed therein may be formed on the base layer 52.

The mask 53 according to an embodiment of the present inventive concept may include a first material layer 53a formed on the base layer 52, and a second material layer 53b formed on the first material layer 53a. An etching rate of the second material layer 53b may be greater than an etching rate of the first material layer 53a.

The first material layer 53a may be provided as the etch stop layer. That is, the first material layer 53a may have an etching rate lower than an etching rate of the second material layer 53b in the same etching conditions.

At least the first material layer 53a may be formed of a material having electrical insulation properties, and the second material layer 53b may also be formed of an insulating material as needed.

The first and second material layers 53a and 53b may be formed of different materials to obtain a difference in etching rates. For example, the first material layer 53a may be a SiN layer and the second material layer 53b may be a $SiO_2$ layer. Alternatively, such a difference in etching rates may be implemented using pore density. In this case, the first and second material layers 53a and 53b may be formed of the same material having different pore densities.

The total thickness of the first and second material layers 53a and 53b may be designed in consideration of a desired height of a nanostructure. The first material layer 53a may have a thickness smaller than that of the second material layer 53b. An etch stop level through the first material layer 53a may be positioned at a depth equal to or less than ⅓ of the overall height of the mask 53, that is, the total thickness of the first and second material layers 53a and 53b, from the surface of the base layer 52.

The overall height of the mask 53, that is, the total thickness of the first and second material layers 53a and 53b may be 10 nm to 100 μm.

After the first and second material layers 53a and 53b are sequentially formed on the base layer 52, a plurality of openings H may be formed in the first and second materials layers to expose regions of the base layer 52 therethrough (see FIG. 5B). The size of each opening H may be designed in consideration of a desired size of the light emitting nanostructure. For example, the opening H may have a width of 50 nm or less, specifically, 200 nm.

The openings H may be formed through a semiconductor process, for example, a deep-etching process to have a relatively high aspect ratio. The openings H may be implemented to have an aspect ratio of 5:1 or higher, specifically, 10:1 or higher.

Cross-sectional shapes of the openings H and the alignment thereof may be variously implemented. For example, the opening H may have various cross-sectional shapes such as a polygonal shape, a quadrangular shape, an elliptical shape or a circular shape. Although the case in which the opening H shown in FIG. 1B has a rod shape is illustrated, the embodiment is not limited thereto. The opening H may be variously shaped using an appropriate etching process.

Figure 5C:
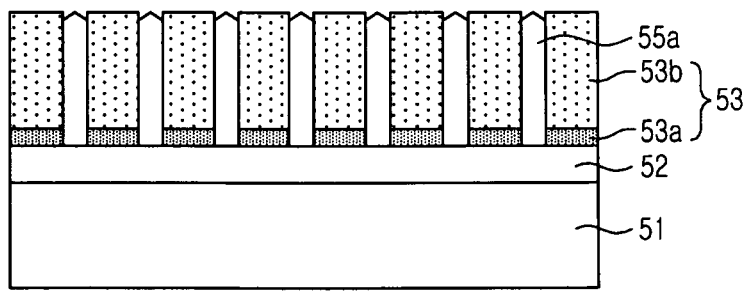

Next, as shown in FIG. 5C, a first conductivity type semiconductor is grown on the exposed regions of the base layer 52 such that the plurality of openings H are filled with the first conductivity type semiconductor, thereby forming a plurality of nanocores 55a.

The first conductivity type semiconductor of the nanocores 55a may be an n-type nitride semiconductor, for example, may be a crystal satisfying n-type $Al_xIn_yGa_{1-x-y}N$ ($0 \le x \le 1$, $0 \le y \le 1$, $0 \le x+y \le 1$). The first conductivity type semiconductor configuring the nanocores 55a may be formed of the same material as the first conductivity type semiconductor of the base layer 52. For example, the base layer 52 and the nanocores 55a may be formed of n-type GaN.

A nitride single crystal configuring the nanocores 55a may be formed using metal organic chemical vapor deposition (MOCVD) or molecular beam epitaxy (MBE). The mask 53 may serve as a mold for a grown nitride single crystal to provide the nanocores 55a having shapes corresponding to shapes of the openings. That is, the nitride single crystal may be selectively grown on regions of the base layer 52 exposed to the openings H by using the mask 53 to fill the openings H therewith. The nitride single crystal selectively grown on regions of the base layer 52 exposed to the openings H may have a shape corresponding to shapes of the openings H.

Figure 5D:
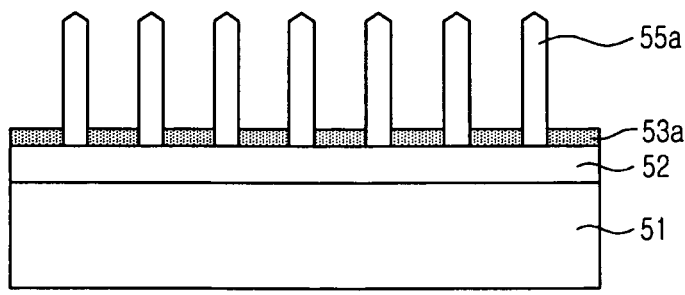

Next, as shown in FIG. 5D, the mask 53 may be partially removed using the etch stop layer such that side surfaces of the plurality of nanocores 55a are exposed.

In an embodiment of the present inventive concept, an etching process may be performed in such a manner that only the second material layer 53b may be selectively removed while the first material layer 53a remains. In an etching process according to an embodiment of the present inventive concept, the first material layer 53a may be used as the etch stop layer, and in a subsequent process, the first material layer 53a may prevent an active layer 55b and a second conductivity type semiconductor layer 55c from contacting the base layer 52.

Figure 5E:
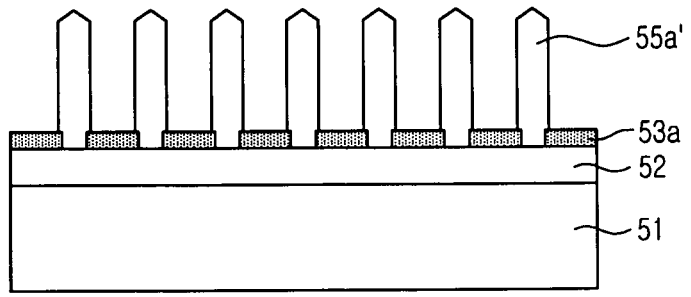

As in an embodiment of the present inventive concept, in the process of manufacturing light emitting nanostructures by using a mask provided with openings as a mold, a heat treatment process may be further included to improve crystalline properties. FIG. 5E illustrates a nanocore 55a' that has been heat-treated to have improved crystalline properties.

After removing the mask, a surface of the nanocore 55a may be subjected to a heat treatment in a predetermined condition such that a crystal plane of the nanocore 55a may be changed to a stable surface suitable for crystal growth, such as a semi-polar or non-polar crystal plane. Such a process may be explained with reference to FIGS. 6A and 6B.

Figure 6A:
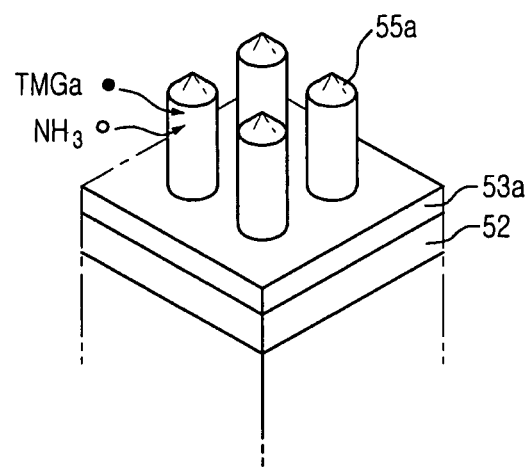
FIGS. 6A and 6B are mimetic diagrams respectively showing heat treatment processes applied to FIGS. 5D and 5E.
Figure 6B:
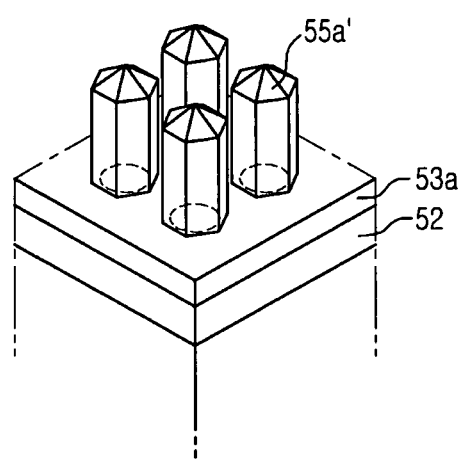

FIGS. 6A and 6B are mimetic diagrams respectively showing heat treatment processes applied to FIGS. 5D and 5E.

FIG. 6A illustrates nanocores 55a obtained in the process of FIG. 5D. Each of the nanocores may have crystal planes determined depending on a cross-sectional shape of an opening. Although the obtained nanocore 55a has crystal planes determined depending on a cross-sectional shape of the opening, the crystal planes of the nanocore 55a provided as described above may be relatively unstable, which may be a factor deteriorating a subsequent crystal growth condition.

As in an embodiment of the present inventive concept, when the opening has a cylindrical rod shape, a side surface of the nanocore may have a curved surface rather than a specific crystal plane.

When this nanocore is subjected to a heat treatment, unstable crystals on the surface thereof (as shown in FIG. 6A) may be re-aligned, such that a stable crystal plane such as in semi-polarity or non-polarity may be formed as illustrated in FIG. 6B. The heat treatment may be performed under a condition of at least 800° C. for several to several tens of minutes, thereby converting an unstable crystal plane into a stable crystal plane.

For example, when a plane C (0001) of the sapphire substrate is grown, the nanocores shown in FIG. 6A may be subjected to a heat treatment at a temperature of 800° C. or above to be then converted into a stable curved surface, a non-polar surface (an m-plane). A process of stabilizing such a crystal plane may be implemented through a high-temperature heat treatment process. When crystals positioned on the surface at a relatively high temperature are re-aligned or a source gas remains in a chamber, it can be understood that partial re-growth is performed to have a stable crystal plane through deposition of the remaining source gas.

In particular, in the case of re-growth, a heat treatment process may be performed in an atmosphere in which source gas remains in a chamber, or a heat treatment may be performed in a condition of intentionally supplying a relatively small amount of source gas. For example, as shown in FIG. 6A, in the case of an MOCVD chamber, TMGa and $NH_3$ remain, and in this residual atmosphere, the heat treatment may be performed such that source gas reacts with a nanocore surface to thus realize partial re-growth so as to have a stable crystal plane. Due to the re-growth, the size of nanocore 55a' may be slightly increased as shown in FIG. 6B.

As described above, the heat treatment may be performed in the MOCVD in conditions similar to a core formation conditions after removing the mask and may improve a surface quality of a nanostructure. That is, through the heat treatment process, non-uniformity (for example, a defect or the like) on a surface of a core manufactured after removing the mask may be eliminated, such that a shape of the core can be controlled to have a stable structure, for example, a hexagonal pillar form. A temperature of the heat treatment process as described above may be a temperature similar to a temperature in a core growth condition, for example, 800 to 1200° C.

Figure 5F:
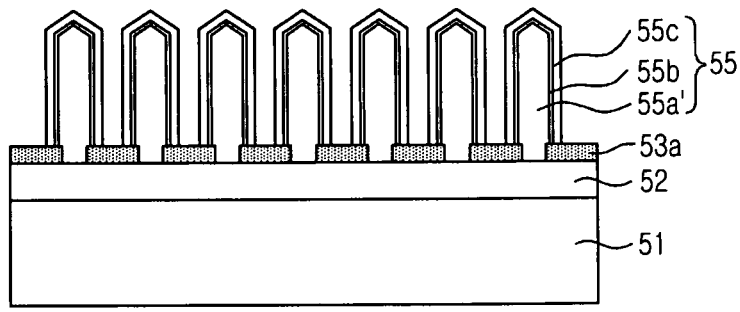
Figure 5G:
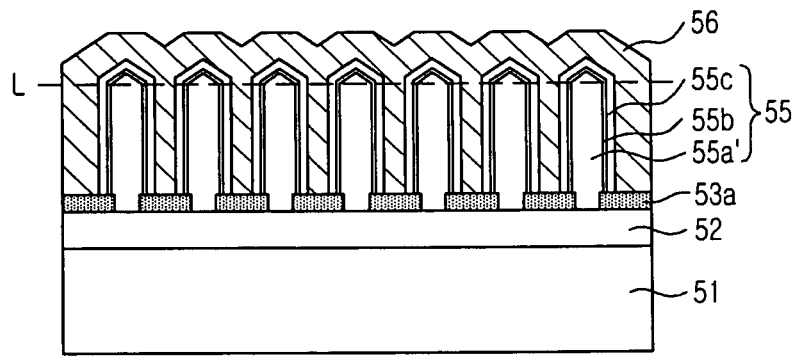
Figure 5H:
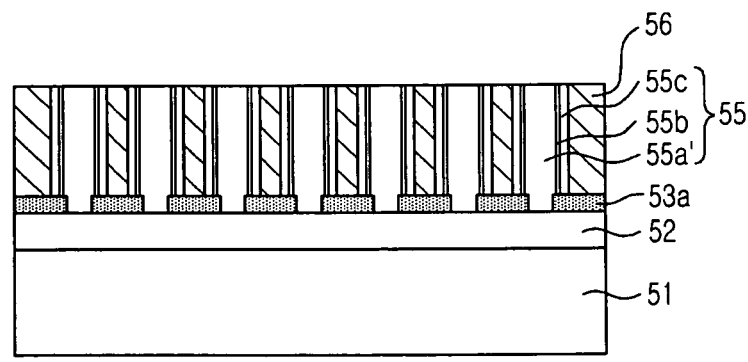

Next, as illustrated in FIG. 5F, the active layer 55b and the second conductivity type semiconductor layer 55c may be sequentially grown on surfaces of the plurality of nanocores 55a'.

Through the process as described above, light emitting nanostructures 55 may have a core-shell structure in which the first conductivity type semiconductor is provided as the nanocores 55a, and the active layer 55b and the second conductivity type semiconductor layer 55c surrounding the respective nanocores 55a are provided as shell layers.

The active layer 55b may have a multiple quantum well (MQW) structure in which quantum well layers and quantum barrier layers are alternately stacked, for example, may have an GaN/InGaN structure in the case of a nitride semiconductor. Here, the active layer 55b may also have a single quantum well (SQW) structure.

The second conductivity type semiconductor layer 55c may be a crystal satisfying p-type $Al_xIn_yGa_{1-x-y}N$. The second conductivity type semiconductor layer 55c may include an electron blocking layer (not separately shown) in a portion thereof adjacent to the active layer 55b. The electron blocking layer (not separately shown) may have a multilayer structure in which a plurality of layers having different compositions of n-type $Al_xIn_yGa_{1-x-y}N$ are stacked or may have at least one layer configured of $Al_yGa_{(1-y)}N$. The electron blocking layer (not separately shown) may have a band gap greater than a band gap of the active layer 55b to thus prevent electrons from flowing to the second conductivity type (p-type) semiconductor layer 55c.

Each of the nanocores 55a may include a main part providing a side surface having a first crystal plane in a growth direction and an upper part providing an upper surface having a second crystal plane different from the first crystal plane.

When the base layer 52 is a nitride single crystal including an upper surface having a c-plane, the side surface of the main part may have a crystal plane perpendicular to the growth surface of the base layer 52, that is, a non-polar m-plane, and the upper surface of the upper part may have a semi-polar r-plane different from the m-plane. In this manner, the surfaces of the nanocore 55a may be configured of a plurality of different crystal planes.

Thus, as described above, even when the active layer 55b is grown on the surfaces of the nanocore 55a through the same process, a composition of the active layer 55b (in particular, the content of indium) may be different due to differences in characteristics of the respective crystal planes. Thus, as in FIGS. 5G and 5H, a process of removing a portion of the active layer formed on a crystal plane of the nanocore from which light having a wavelength outside of desired wavelength range may be emitted may be additionally undertaken as follows.

First, a contact electrode 56 may be formed on the light emitting nanostructures 55. In this case, as illustrated in FIG. 3C, the contact electrode 56 may be formed to fill spaces between the light emitting nanostructures 55. In this manner, the filled contact electrode 55 may serve to structurally support the light emitting nanostructures 55 in a subsequent planarizing process.

Then, a process of performing planarizing to a level L may be performed so as to remove a portion of the active layer formed on the upper surface of the nanocore 55a. As a result, the portion of the active layer formed on the upper surface of the nanocore 55a may be removed, and portions of the active layer 55b may remain only on the side surfaces of nanocore 55a. The side surfaces of the nanocore 55a may be the same crystal planes, such that the remaining portions of the active layer 55b may accurately exhibit desired wavelength characteristics.

In the nanocore 55a, since the side surfaces thereof may generally have a larger area than an area of the upper surfaces thereof, effects due to a reduction in a light emitting area may not be significant. In particular, in the case of the nanocore 55a having a high aspect ratio, improvements in luminescence properties, rather than the effects due to a reduction in a light emitting area may be significant.

The above-mentioned embodiment of the present inventive concept provides the case in which the mask is configured of two material layers, but the present inventive concept is not limited thereto. That is, three or more material layers may be employed.

For example, in the case of a mask including first to third material layers sequentially formed on the base layer, the second material layer may be provided as an etch stop layer and may be formed of a material different from materials of the first and third material layers. The first and third material layers may be formed of the same material as needed.

Under the same etching conditions, since at least the second material layer has an etching rate lower than an etching rate of the third material layer, the second material layer may serve as an etch stop layer. At least the first material layer may be formed of a material having an electrical insulation property, and the second or third material layer may be formed of an insulating material as necessary.

The above-described embodiment of the present inventive concept exemplifies a method of manufacturing a nanostructure semiconductor light emitting device, for growing nanocores by using a mask having openings, as a mold. However, the method according to the above-described embodiments may be modified or improved in various embodiments.

In another embodiment of the present inventive concept, when a nanocore is grown using a mold structure, an upper part of the nanocore may have another shape or a plurality of nanocores may be grown to have different heights, thus causing an uneven structure or a rough structure, and in order to prevent a non-uniform distribution of nanocores from inducing a disadvantageous influence upon a semiconductor light emitting device, a planarizing process may be further included after forming the plurality of nanocores, such that upper surfaces of the plurality of nanocores may be planarized to have the same level.

As such, in the process of planarizing the nanocores to have the same level, at least a portion of nanocores among the plurality of nanocores may be formed such that at least one of cross-sectional areas and intervals between the at least a portion of nanocores are different from cross-sectional areas and intervals of remaining nanocores.

By designing any one of the cross-sectional areas of the light emitting structures and intervals therebetween to be differentiated, even when the same active layer formation process is applied thereto, two or more different wavelengths of light may be emitted. As described above, two or more different wavelengths of light may be emitted by differentiating the shapes of nanostructures, thereby obtaining white light from a single device.

FIGS. 7A through 7F are cross-sectional views illustrating respective main processes of a method of manufacturing a nanostructure semiconductor light emitting device according to another embodiment of the present inventive concept (e.g., a planarizing process).

Figure 7A:
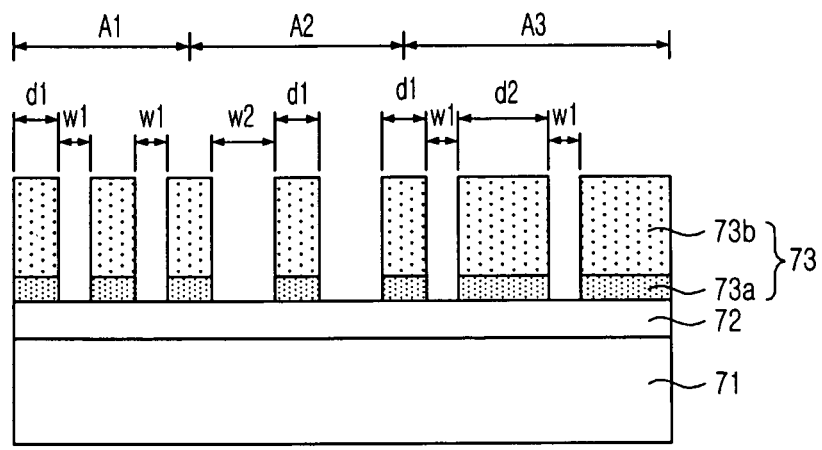
FIGS. 7A through 7F are cross-sectional views illustrating respective main processes of a method of manufacturing a nanostructure semiconductor light emitting device according to another embodiment of the present inventive concept (a planarizing process introduction).

First, as shown in FIG. 7A, a mask 73 having a plurality of openings H and an etch stop layer interposed therein may be formed on a base layer 72 formed on a substrate 71.

The mask 73 according to an embodiment of the present inventive concept may include a first material layer 73a formed on the base layer 72, and a second material layer 73b formed on the first material layer 73a. An etching rate of the second material layer 73b may be greater than an etching rate of the first material layer 73a.

The openings H may have different shapes. In detail, in an embodiment of the present inventive concept, three different groups of openings may be formed. Openings A2 of a second group have an interval d1 therebetween, which is the same as an interval d2 between openings A1 of a first group. The openings A2 of the second group may have a width w2 greater than a width w1 of the openings A1 of the first group. Openings A3 of a third group may have a width w3 the same as the width w1 of the openings A1 of the first group. The openings A3 of the third group may have an interval d3 therebetween greater than the interval d1 between the openings A1 of the first group.

Substantially, the increase in an interval between the openings indicates a relative increase in a contact amount of source gas with regard to the same area, and thus, a growth speed of nanocores 75a may be relatively rapid. The increase in a width of the opening indicates a relative reduction in the contact amount of source gas in the same area, and thus, the growth speed of the nanocores 75a may be relatively slow.

Figure 7B:
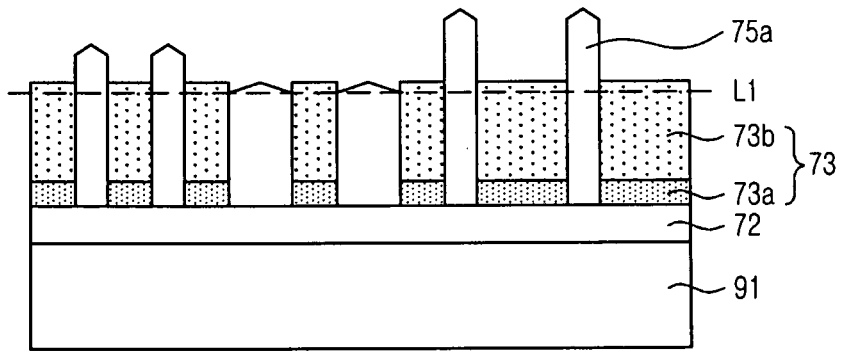

For reasons described above, the nanocores 75a may have different heights for respective groups, for example, three groups, due to the difference in a growth speed of the nanocores 75a between the width of the opening and the interval between the openings as shown in FIG. 7B. In order to improve the non-uniform height, planarization may be performed in the present process to form an appropriate level (e.g., L1 as shown in FIG. 7B) as shown in FIG. 7C, thereby achieving a uniform height of the nanocores 75a per respective group.

Since the mask 73 is used as a structure supporting the nanocores 75a in the planarization process as described above, the planarization process may be easily performed without damage to the nanocores 75a.

Figure 7C:
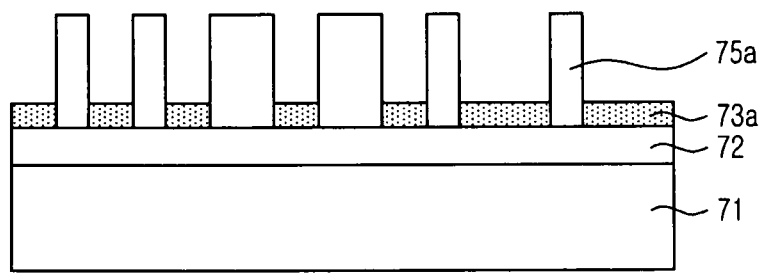

After the polarization process, the mask 73 may be partially removed using the etch stop layer to expose side surfaces of the planarized nanocores 75a as shown in FIG. 7C. That is, in a planarizing process according to an embodiment of the present inventive concept, the second material layer 73b may only be removed and the first material layer 73a may remain.

Figure 7D:
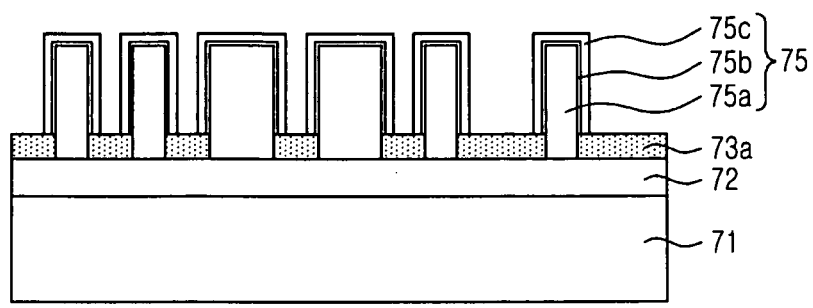

Subsequently, an active layer 75b and a second conductivity type semiconductor layer 75c may be sequentially grown on the surfaces of the plurality of nanocores 75a as shown in FIG. 7D.

Through the above-mentioned process, a light emitting nanostructure 75 may have a core-shell structure in which the first conductivity type semiconductor is provided as the nanocores 75a, and the active layer 75b and the second conductivity type semiconductor layer 75c surrounding the nanocore 75a are provided as shell layers.

Figure 7E:
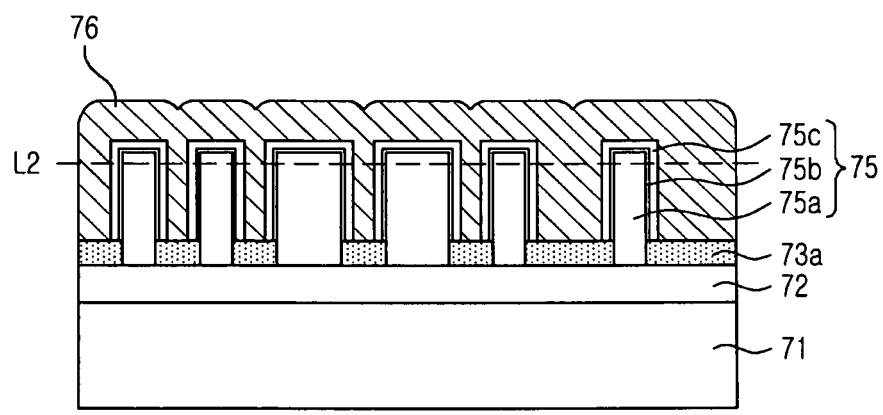
Figure 7F:
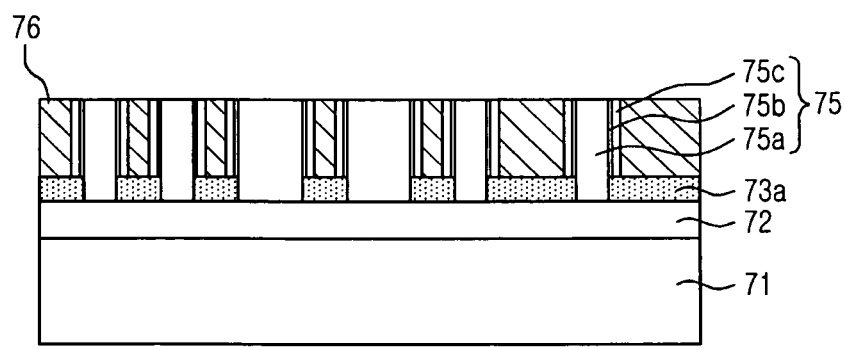

Specifically, although the active layer 75b is grown through the same process, a portion of the active layer grown on the top surface (e.g., c-plane) of the nanocore 75a may have the content of indium lower than a content of indium of a portion of the active layer 75b grown on the side surfaces (e.g., m-planes) of the nanocore 75a. As a result, the portion of the active layer 75b grown on the top surface (c-plane) of the nanocore 75a may emit light having a wavelength outside of an intended wavelength range. Thus, in an embodiment of the present inventive concept, a process of removing a portion of the active layer formed on a crystal plane of the nanocore, from which light having a wavelength outside of desired wavelength range may be emitted, may be additionally undertaken as illustrated in FIGS. 7E and 7F.

First, a contact electrode 76 may be formed on the light emitting nanostructures 75. In this case, as illustrated in FIG. 7E, the contact electrode 76 may be formed to fill spaces between the light emitting nanostructures 75. In this manner, the filled contact electrode 76 may serve to structurally support the light emitting nanostructures 75 in a subsequent planarizing process.

The contact electrode layer 76 may be obtained by forming a seed layer on the surfaces of the light emitting nanostructures 75 and then performing electroplating thereon. This seed layer may be formed of a material suitable for ohmic contact with the second conductivity semiconductor layer.

The contact electrode layer 76 used in an embodiment of the present inventive concept may be formed using a reflective metal layer, and it can be understood that light is extracted to the substrate, but the present inventive concept is not limited thereto. The contact electrode layer 76 may be formed employing a transparent electrode material such as indium tin oxide (ITO) such that light may be extracted from the light emitting nanostructure 75.

An embodiment of the present inventive concept illustrates that an electrode material is used as a support for the light emitting nanostructures 75; however, a method of providing a thin contact electrode layer along the surfaces of the light emitting nanostructures and providing a filling material may be implemented. In this case, an insulating filling material may be used as a support for the light emitting nanostructures in a subsequent planarizing process.

Then, a process of performing planarizing to a level L2 (see FIG. 7E) so as to remove a portion of the active layer formed on the upper surface of the nanocore 75a may be performed. As a result, the portion of the active layer formed on the upper surface of the nanocore 75a may be removed, and portions of the active layer 75b may remain only on the side surfaces of nanocore 75a. The side surfaces of the nanocore 75a may be the same crystal planes, such that the remaining portions of the active layer 75b may accurately exhibit desired wavelength characteristics.

In the nanocore 75a, since the side surfaces thereof may generally have a larger area than an area of the upper surfaces thereof, effects due to a reduction in a light emitting area may not be significant. In particular, in the case of the nanocore 75a having a high aspect ratio, improvements in luminescence properties, rather than the effects due to a reduction in a light emitting area, may be significant.

An embodiment of the present inventive concept illustrates that the light emitting nanostructure has side surfaces perpendicular to the surface of the base layer, but may have side surfaces having a predetermined angle of inclination. Such inclined side surfaces may be advantageous in terms of the extraction of light from the light emitting nanostructure.

The light emitting nanostructure having the inclined side surface may be manufactured in various schemes. For example, in a manufacturing method using a mask as a mold structure, an opening of the mask may be formed to have an appropriate inclined surface to provide a nanocore having an inclined side surface, and an active layer and a second conductivity type semiconductor layer may be grown to have a predetermined thickness, whereby a light emitting nanostructure having a desired inclined side surface may be provided.

Figure 8A:
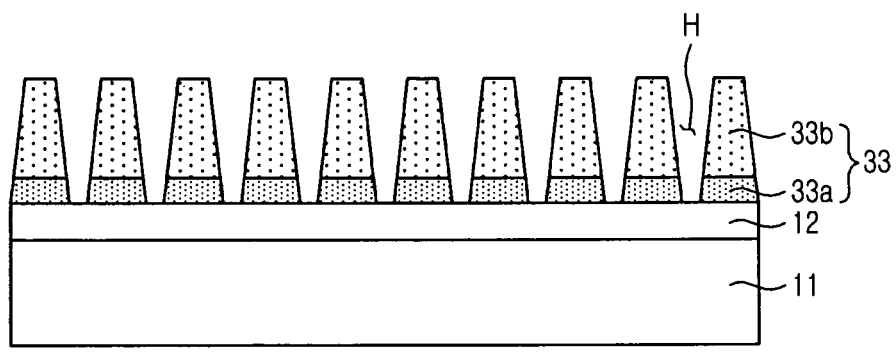
FIGS. 8A and 8B are side cross-sectional views respectively illustrating shapes of an opening that may be formed in a mask employed in an embodiment of the present inventive concept.
Figure 8B:
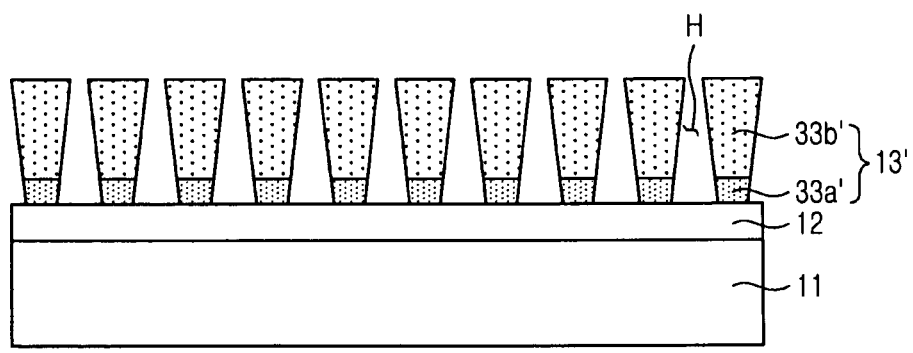

More specifically, although the case in which the opening H shown in FIG. 5B has a rod shape is illustrated, the present inventive concept is not limited thereto. The shape of the opening H may be variously formed using an appropriate etching process. As such examples, FIGS. 8A and 8B illustrate different shapes of openings formed in the masks. In FIG. 8A, a mask 33 formed of first and second material layers 33a and 33b may have a pillar shaped opening H having a cross-sectional area gradually increased in an upward direction. In FIG. 8B, a mask 33' formed of first and second material layers 33a' and 33b' may have a pillar shaped opening H having a cross-sectional area gradually reduced in the upward direction.

Using such a mask, a nanocore having an appropriate inclined surface corresponding to an opening shape and a light emitting nanostructure may be formed.

As set forth above, according to embodiments of the present inventive concept, even in the case of using a nanostructure, an active layer may be grown on the same crystal planes, such that uniform luminescence properties may be obtained in the overall region of the active layer.

In addition, even when a growth height of a nanostructure is different due to uneven deposition according to regions thereof in a crystal growth process, since a planarizing process may be easily used therein, a uniform height of a final nanostructure may be secured. In particular, such a process may be used in differentiating cross-sectional areas of nanostructures and an interval therebetween in order to implement multiple wavelengths of light, for example, white light.

While the present inventive concept has been shown and described in connection with the embodiments, it will be apparent to those skilled in the art that modifications and variations can be made without departing from the spirit and scope of the present inventive concept as defined by the appended claims.

What is claimed is:

1. A method of manufacturing a core-shell structure semiconductor light emitting device, the method comprising:
    growing, by using a first conductivity type semiconductor, a plurality of cores on selective portions of a base layer including the first conductivity type semiconductor, such that each of the plurality of cores includes a main part that has a side surface having a first crystal plane in a growth direction and an upper part that has a surface having a second crystal plane different from the first crystal plane;
    forming a plurality of light emitting core-shell structures by sequentially growing a shell including an active layer and a second conductivity type semiconductor layer on surfaces of the respective cores;
    forming a contact electrode on a surface of the second conductivity type semiconductor layer; and
    planarizing a surface of the core-shell structure semiconductor light emitting device in which the contact electrode is disposed, so as to remove a portion of the active layer disposed on the second crystal plane,
    wherein the growing of the plurality of cores comprises growing at least a group of cores among the plurality of cores to have cross-sectional areas or an interval therebetween different from cross-sectional areas of or an interval between another group of cores among the plurality of cores.

2. The method of claim 1, wherein the growing of the plurality of cores includes:
    providing the base layer formed of the first conductivity type semiconductor;
    forming, on the base layer, a mask including a plurality of layers including an etch stop layer;
    forming, in the mask, a plurality of openings through which regions of the base layer are exposed;
    forming the plurality of cores by growing the first conductivity type semiconductor on the exposed regions of the base layer so as to fill the plurality of openings with the first conductivity type semiconductor; and
    partially removing the mask by using the etch stop layer to expose the side surfaces of the plurality of cores.

3. The method of claim 2, wherein the mask includes a first material layer disposed on the base layer and serving as the etch stop layer, and a second material layer disposed on the first material layer and having an etching rate lower than an etching rate of the first material layer.

4. The method of claim 2, wherein:
    the mask includes first to third material layers sequentially disposed on the base layer, and
    the second material layer includes a material different from materials of the first and third material layers and serves as the etch stop layer.

5. The method of claim 2, further comprising:
    heat treating the plurality of cores after the partially removing of the mask and before the sequentially growing of the active layer and the second conductivity type semiconductor layer.

6. The method of claim 5, wherein the heat treating of the plurality of cores is performed at a temperature ranging from 800 to 1200° C.

7. The method of claim 2, further comprising:
    applying a planarizing process to upper surfaces of the plurality of cores to be planarized to have an identical level, after the forming of the plurality of cores.

8. A method of manufacturing a core-shell structure semiconductor light emitting device, the method comprising:
    growing, by using a first conductivity type semiconductor, a plurality of cores on selective portions of a base layer including the first conductivity type semiconductor, such that each of the plurality of cores includes a main part that has a side surface having a first crystal plane in a growth direction and an upper part that has a surface having a second crystal plane different from the first crystal plane;
    forming a plurality of light emitting core-shell structures by sequentially growing a shell including an active layer and a second conductivity type semiconductor layer on surfaces of the respective cores;
    forming a contact electrode on a surface of the second conductivity type semiconductor layer; and
    planarizing a surface of the core-shell structure semiconductor light emitting device in which the contact electrode is disposed, so as to remove a portion of the active layer disposed on the second crystal plane,
    wherein the growing of the plurality of cores includes:
        providing the base layer formed of the first conductivity type semiconductor;

forming, on the base layer, a mask including a plurality of layers including an etch stop layer;

forming, in the mask, a plurality of openings through which regions of the base layer are exposed;

forming the plurality of cores by growing the first conductivity type semiconductor on the exposed regions of the base layer so as to fill the plurality of openings with the first conductivity type semiconductor; and partially removing the mask by using the etch stop layer to expose the side surfaces of the plurality of cores.

9. The method of claim 8, wherein the mask includes a first material layer disposed on the base layer and serving as the etch stop layer, and a second material layer disposed on the first material layer and having an etching rate lower than an etching rate of the first material layer.

10. The method of claim 8, wherein:
the mask includes first to third material layers sequentially disposed on the base layer, and
the second material layer includes a material different from materials of the first and third material layers and serves as the etch stop layer.

11. The method of claim 8, further comprising:
heat treating the plurality of cores after the partially removing of the mask and before the sequentially growing of the active layer and the second conductivity type semiconductor layer.

12. The method of claim 11, wherein the heat treating of the plurality of cores is performed at a temperature ranging from 800 to 1200° C.

13. The method of claim 8, further comprising:
applying a planarizing process to upper surfaces of the plurality of cores to be planarized to have an identical level, after the forming of the plurality of cores.

14. The method of claim 8, wherein at least a group of cores among the plurality of cores have cross-sectional areas or an interval therebetween different from cross-sectional areas of or an interval between another group of cores among the plurality of cores.

15. A method of manufacturing a core-shell structure semiconductor light emitting device, the method comprising:
growing, by using a first conductivity type semiconductor, a plurality of cores on selective portions of a base layer including the first conductivity type semiconductor, such that each of the plurality of cores includes a main part that has a side surface having a first crystal plane in a growth direction and an upper part that has a surface having a second crystal plane different from the first crystal plane;

forming a plurality of light emitting core-shell structures by sequentially growing a shell including an active layer and a second conductivity type semiconductor layer on surfaces of the respective cores;

forming a contact electrode on a surface of the second conductivity type semiconductor layer by homogeneously filling a space between the plurality of light emitting core-shell structures with an electrode material to cover the plurality of light emitting core-shell structures; and planarizing upper surfaces of the plurality of light emitting core-shell structures so as to expose upper surfaces of the plurality of the cores, wherein the growing of the plurality of cores includes:
providing the base layer formed of the first conductivity type semiconductor;
forming, on the base layer, a mask including a plurality of layers including an etch stop layer;
forming, in the mask, a plurality of openings through which regions of the base layer are exposed;
forming the plurality of cores by growing the first conductivity type semiconductor on the exposed regions of the base layer so as to fill the plurality of openings with the first conductivity type semiconductor; and
partially removing the mask by using the etch stop layer to expose the side surfaces of the plurality of cores.

16. The method of claim 15, wherein the upper surfaces of the light emitting core-shell structures are substantially planar with each other, after the planarizing step.

17. The method of claim 15, wherein the upper surfaces of the light emitting core-shell structures are substantially planar with the filling material after the planarizing step.

18. The method of claim 15, wherein the mask includes a first material layer disposed on the base layer and serving as the etch stop layer, and a second material layer disposed on the first material layer and having an etching rate lower than an etching rate of the first material layer.

19. The method of claim 15, wherein the growing of the plurality of cores comprises growing at least a group of cores among the plurality of cores to have cross-sectional areas or an interval therebetween different from cross-sectional areas of or an interval between another group of cores among the plurality of cores.

* * * * *